US008130013B2

United States Patent
Lin et al.

(10) Patent No.: US 8,130,013 B2
(45) Date of Patent: Mar. 6, 2012

(54) DRIVING CIRCUIT OF INPUT/OUTPUT INTERFACE WITH CHANGEABLE OUTPUT FORCE

(75) Inventors: Yu-Tong Lin, Hsinchu County (TW); Yu-Chia Liu, Kaohsiung (TW); Chien-Wei Lee, Yilan County (TW)

(73) Assignee: Phison Electronics Corp., Miaoli (TW)

( * ) Notice: Subject to any disclaimer, the term of this patent is extended or adjusted under 35 U.S.C. 154(b) by 11 days.

(21) Appl. No.: 12/702,016

(22) Filed: Feb. 8, 2010

(65) Prior Publication Data

US 2011/0148475 A1 Jun. 23, 2011

(30) Foreign Application Priority Data

Dec. 17, 2009 (TW) .............................. 98143396 A (51) Int. Cl.
*H03K 3/00* (2006.01)
(52) U.S. Cl. ........................ 327/108; 327/112; 326/87
(58) Field of Classification Search .................. 327/108, 327/112; 326/87
See application file for complete search history.

(56) References Cited

U.S. PATENT DOCUMENTS

| 5,036,222 | A | * | 7/1991 | Davis | 326/27 |
| 5,057,711 | A | * | 10/1991 | Lee et al. | 326/27 |
| 5,166,555 | A | * | 11/1992 | Kano | 326/87 |
| 5,534,791 | A | * | 7/1996 | Mattos et al. | 326/27 |
| 5,568,062 | A | * | 10/1996 | Kaplinsky | 326/27 |
| 5,894,238 | A | * | 4/1999 | Chien | 327/112 |
| 7,098,704 | B2 | * | 8/2006 | Ikezaki | 327/112 |
| 7,834,667 | B1 | * | 11/2010 | Wong | 327/108 |
| 2005/0189964 | A1 | * | 9/2005 | Itoh et al. | 326/87 |
| 2005/0242840 | A1 | * | 11/2005 | Ngo et al. | 326/87 |

* cited by examiner

*Primary Examiner* — Kenneth B. Wells
(74) *Attorney, Agent, or Firm* — J.C. Patents (57) ABSTRACT

A driving circuit of an input/output (I/O) interface is provided. The driving circuit includes a main output stage and an enhancing unit. The main output stage receives at least one driving signal and outputs an output signal corresponding to an input signal accordingly. The enhancing unit is coupled to the main output stage. The enhancing unit receives and detects the level of the output signal so as to drive the output force of the main output stage in a first output level or a second output level, wherein the first output level is higher than the second output level.

11 Claims, 5 Drawing Sheets

DRIVING CIRCUIT OF INPUT/OUTPUT INTERFACE WITH CHANGEABLE OUTPUT FORCE

CROSS-REFERENCE TO RELATED APPLICATION

This application claims the priority benefit of Taiwan application serial no. 98143396, filed on Dec. 17, 2009. The entirety of the above-mentioned patent application is hereby incorporated by reference herein and made a part of this specification.

BACKGROUND OF THE INVENTION

1. Field of the Invention

The present invention generally relates to a driving circuit, and more particularly, to a driving circuit of an input/output (I/O) interface.

2. Description of Related Art

Figure 6:
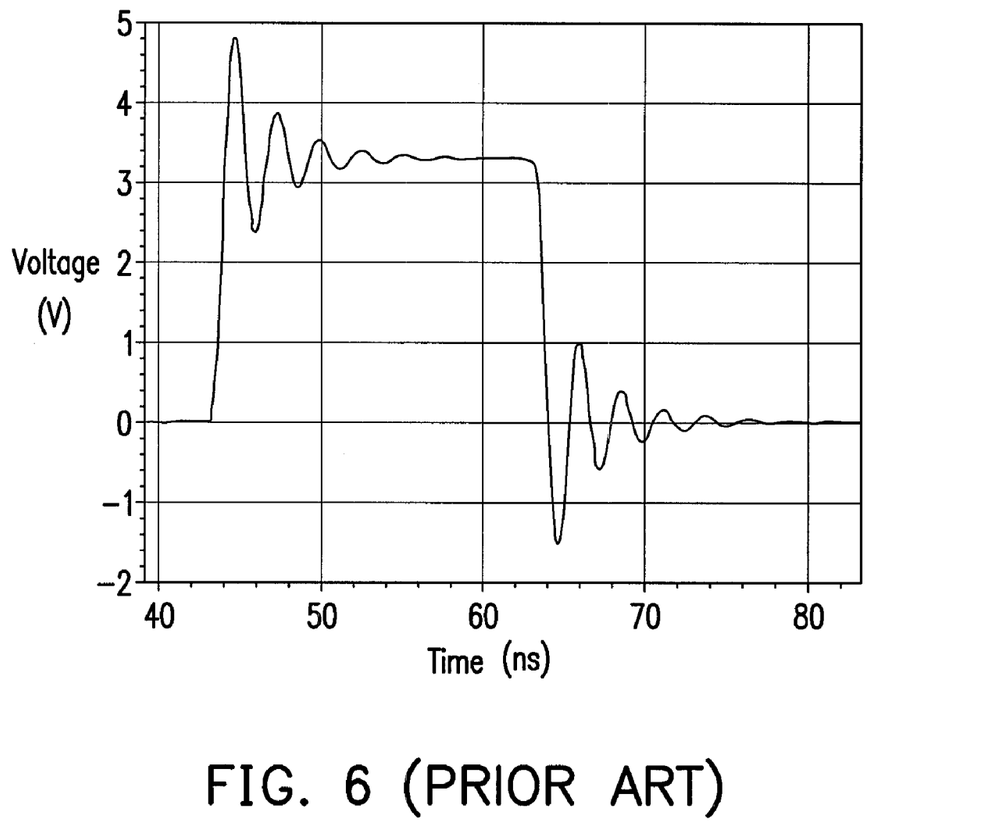
FIG. 6 illustrates the problem of over damping produced on an output signal of a conventional driving circuit disposed in an integrated circuit (IC) when the driving power of the driving circuit is increased.

Generally speaking, when a digital signal is transmitted by a driving circuit (i.e., an input/output (I/O) interface) in an integrated circuit (IC), the driving power of the driving circuit (i.e., the output force of the I/O interface) has to be increased in order to achieve a higher transmission speed. However, when the driving power of the driving circuit is increased, over damping may be produced on the output signal, as shown in FIG. 6. Besides interfering with the system power as power noises, the over damping may further be released as electromagnetic disturbance (EMI) and accordingly cause the driving circuit not to meet the safety specification.

Conventionally, the problem of over damping produced on the output signal of a driving circuit with increased driving power is resolved by adjusting/controlling the slew rate of an inverter of a driving stage in the driving circuit. However, such a solution may greatly reduce the speed of signal output and accordingly affect the processing speed of the entire IC.

SUMMARY OF THE INVENTION

Accordingly, the present invention is directed to a driving circuit of an input/output (I/O) interface, wherein the speed of signal output is increased with an increased driving power so that the processing speed of the entire integrated circuit (IC) is increased and the production of over damping is avoided.

The present invention provides a driving circuit of an I/O interface. The driving circuit includes a main output stage and an enhancing unit. The main output stage receives at least one driving signal and outputs an output signal corresponding to an input signal accordingly. The enhancing unit is coupled to the main output stage. The enhancing unit receives and detects the level of the output signal so as to drive the output force of the main output stage at a first output level or a second output level, wherein the first output level is higher than the second output level.

According to an embodiment of the present invention, if the enhancing unit detects that the level of the output signal at a rising edge is higher than a first predetermined level or the level of the output signal at a falling edge is lower than a second predetermined level, the enhancing unit drives the output force of the main output stage at the second output level. Otherwise, the enhancing unit drives the output force of the main output stage at the first output level.

The present invention also provides a driving circuit of an I/O interface. The driving circuit includes a main output stage, an auxiliary output stage, and a detection unit. The main output stage receives at least one driving signal and outputs an output signal corresponding to an input signal accordingly. The auxiliary output stage is coupled to the main output stage. The auxiliary output stage receives two detection signals so as to drive the output force of the main output stage at a first output level or a second output level, wherein the first output level is higher than the second output level. The detection unit is coupled to the main output stage and the auxiliary output stage. The detection unit receives the input signal and the output signal and detects the level of the output signal at a rising edge and a falling edge, so as to output the two detection signals for turning on/off the auxiliary output stage.

According to an embodiment of the present invention, if the detection unit detects that the level of the output signal at the rising edge is higher than a first predetermined level or the level of the output signal at the falling edge is lower than a second predetermined level, the detection unit outputs the two detection signals to turn off the auxiliary output stage, so as to drive the output force of the main output stage at the second output level. Otherwise, the detection unit outputs the two detection signals to turn on the auxiliary output stage, so as to drive the output force of the main output stage at the first output level.

As described above, the present invention provides a driving circuit, wherein the output force of the main output stage is adaptively adjusted according to the level of an output signal of the driving circuit. When the level of the output signal at its rising edge and falling edge is respectively higher than a first predetermined level and lower than a second predetermined level, the auxiliary output stage is turned off and only the main output stage is turned on. In this case, a smaller output force is produced by the main output stage alone and accordingly the problem of over damping on the output signal is avoided. Contrarily, when the level of the output signal at its rising edge and falling edge is respectively lower than the first predetermined level and higher than the second predetermined level, both the main output stage and the auxiliary output stage are turned on. Because the first predetermined level and the second predetermined level are respectively close to a high level and a low level, the transmission speed of the output signal is not affected. Thereby, in the driving circuit provided by the present invention, the speed of signal output is increased and accordingly the problem of over damping is avoided when the driving power is increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts. Moreover, in the following embodiments, when a certain device is described to be connected or coupled to another device, such device can be directly connected or coupled to the other device, or can be connected, indirectly linked, electromagnetically connected, or coupled to the other device wirelessly or through at least one component.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

It is also to be noted that the notations "Vcc", "Vdd", "Vee", "Vss", etc. are only in describing voltages at various power supply terminals of exemplary circuits, and they doesn't limit types of transistors, structures of circuits, or voltage level used in the present invention.

Figure 1:
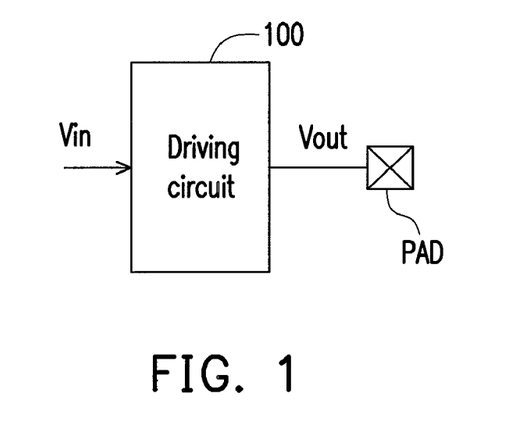
FIG. 1 is a diagram of a driving circuit according to an embodiment of the present invention.
Figure 2:
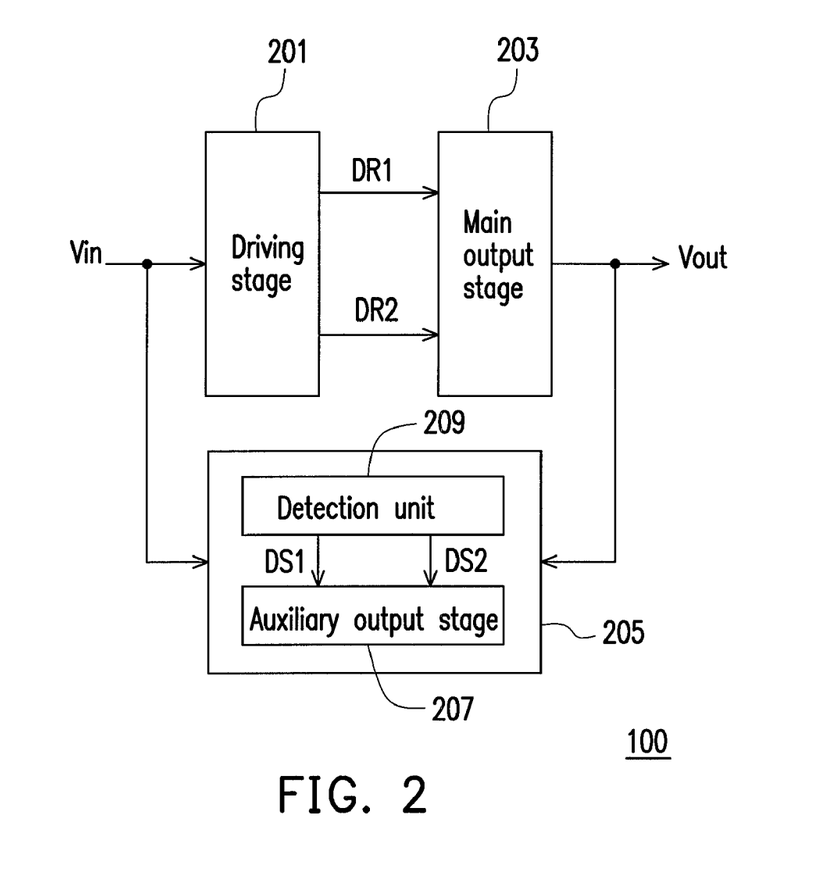
FIG. 2 is a block diagram of a driving circuit according to an embodiment of the present invention.

FIG. 1 is a diagram of a driving circuit 100 according to an embodiment of the present invention. FIG. 2 is a block diagram of the driving circuit 100 according to an embodiment of the present invention. Referring to both FIG. 1 and FIG. 2, the driving circuit 100 may be a digital input/output (I/O) interface, and which receives an input signal Vin and outputs an output signal Vout corresponding to the input signal Vin via an output terminal (for example, a bonding pad or other types of output terminal), wherein the input signal Vin may be generated by an integrated circuit (IC) or by a signal generation unit.

In the present embodiment, the driving circuit 100 includes a driving stage 201, a main output stage 203, and an enhancing unit 205. The driving stage 201 receives the input signal Vin and outputs a first driving signal DR1 and a second driving signal DR2 accordingly, wherein the driving signals DR1 and DR2 have the same phase but are respectively reverse to the input signal Vin. The main output stage 203 is coupled to the driving stage 201, and which receives the first driving signal DR1 and the second driving signal DR2 and outputs the output signal Vout corresponding to the input signal Vin accordingly.

The enhancing unit 205 is coupled to the main output stage 203, and which receives and detects the level of the output signal Vout so as to drive the output force of the main output stage 203 at a first output level or a second output level, wherein the first output level is higher than the second output level. In the present embodiment, the enhancing unit 205 drives the output force of the main output stage 203 at the second output level when the enhancing unit 205 detects that the level of the output signal Vout at its rising edge and falling edge is respectively higher than a first predetermined level and lower than a second predetermined level (i.e., when the level of the output signal Vout at the rising edge is higher than the first predetermined level or the level thereof at the falling edge is lower than the second predetermined level), and the enhancing unit 205 drives the output force of the main output stage 203 at the first output level when the enhancing unit 205 detects that the level of the output signal Vout at its rising edge is lower than the first predetermined level or the level thereof at the falling edge is higher than the second predetermined level.

To be specific, the enhancing unit 205 includes an auxiliary output stage 207 and a detection unit 209. The auxiliary output stage 207 is coupled to the main output stage 203, and which receives a first detection signal DS1 and a second detection signal DS2 so as to drive the output force of the main output stage 203 at the first output level or the second output level. In the present embodiment, the output force of the main output stage 203 is in the first output level (i.e., the output force is enhanced) when the auxiliary output stage 207 is turned on, and the output force of the main output stage 203 is in the second output level (i.e., the output force is maintained) when the auxiliary output stage 207 is turned off, wherein the first output level of the output force is higher than the second output level thereof. In addition, the detection unit 209 is coupled to the main output stage 203 and the auxiliary output stage 207, and which receives the input signal Vin and the output signal Vout having the same phase as the input signal Vin and detects the level of the output signal Vout at its rising edge and falling edge, so as to output the first detection signal DS1 and the second detection signal DS2 for turning on/off the auxiliary output stage 207.

Figure 3:
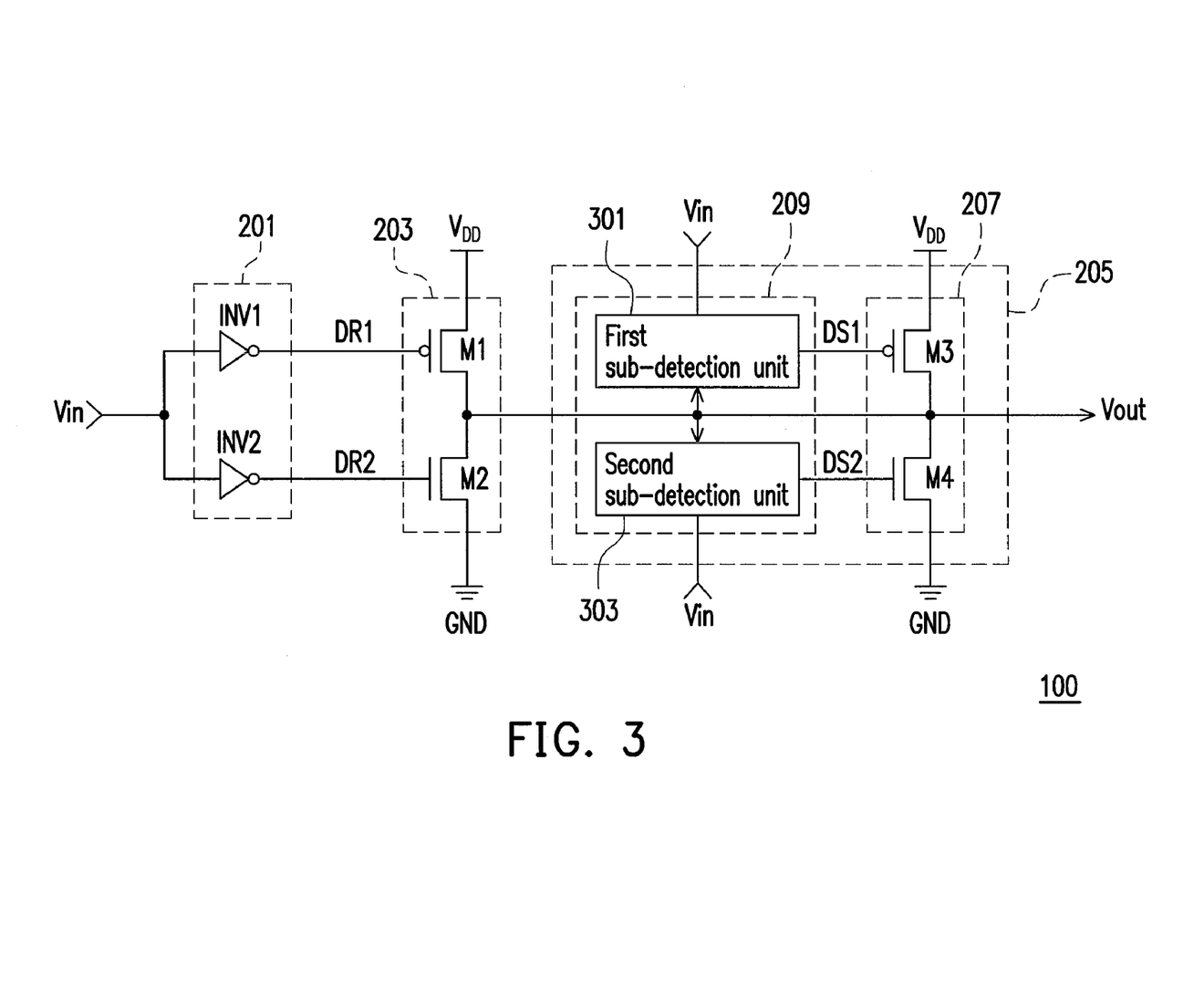
FIG. 3 is a circuit diagram of a driving circuit according to an embodiment of the present invention.

FIG. 3 is a circuit diagram of the driving circuit 100 according to an embodiment of the present invention. Referring to FIG. 3, the driving stage 201 includes a pair of driving units, and the pair of driving units includes inverters INV1 and INV2. The input terminal of the inverter INV1 receives the input signal Vin, and the output terminal of the inverter INV1 outputs the first driving signal DR1. The input terminal of the inverter INV2 receives the input signal Vin, and the output terminal of the inverter INV2 outputs the second driving signal DR2. In the present embodiment, the slew rates of the inverters INV1 and INV2 are fixed. However, in another exemplary embodiment, a mechanism for adjusting/controlling the slew rates of the inverters may also be adopted. In yet another exemplary embodiment, the driving stage 201 may include only one inverter, wherein the input terminal of the inverter receives the input signal Vin, and the output terminal thereof outputs a driving signal reverse to the input signal Vin.

The main output stage 203 includes at least one transistor M1 and at least one transistor M2. In the present exemplary embodiment, the transistor M1 is implemented by using a PMOS transistor (for example, a P-channel metal-oxide-semiconductor field-effect transistor), and the transistor M2 is implemented by using a NMOS transistor (for example, an N-channel metal-oxide-semiconductor field-effect transistor). Thereinafter, the transistor M1 is referred to as a PMOS transistor M1, and the transistor M2 is referred to as a NMOS transistor M2. Herein, it should be noted that the transistors M1 and M2 may also be implemented by using other types of transistors, such as bipolar junction transistors (BJTs).

In the present embodiment, the gate of the PMOS transistor M1 receives the first driving signal DR1, and the source of the PMOS transistor M1 receives a system voltage $V_{DD}$, wherein the level of the system voltage $V_{DD}$ may be the logic high level. The gate of the NMOS transistor M2 receives the second driving signal DR2, the source of the NMOS transistor M2 receives a reference voltage, and the drain of the NMOS transistor M2 is coupled to the drain of the PMOS transistor M1 for outputting the output signal Vout, wherein the level of the reference voltage may be the logic low level (i.e., a ground level GND). In other embodiments of the present invention, multiple PMOS transistors (the number thereof is not limited herein) may be coupled to the PMOS transistor M1 in parallel and multiple NMOS transistors (the number thereof is not limited herein) may be coupled to the NMOS transistor M2 in parallel according to the actual design requirements.

The detection unit 209 includes a first sub-detection unit 301 and a second sub-detection unit 303. The first sub-detection unit 301 receives the input signal Vin and the output signal Vout and detects the level of the output signal Vout at its rising edge, so as to output the first detection signal DS1. The second sub-detection unit 303 receives the input signal Vin and the output signal Vout and detects the level of the output signal Vout at its falling edge, so as to output the second detection signal DS2.

The auxiliary output stage 207 includes at least one transistor M3 and at least one transistor M4, wherein the transistor M3 is implemented by using a PMOS transistor, and the transistor M4 is implemented by using a NMOS transistor. Thereinafter, the transistor M3 is referred to as a PMOS transistor M3, and the transistor M4 is referred to as a NMOS transistor M4. In the present embodiment, the gate of the PMOS transistor M3 is coupled to the first sub-detection unit 301 for receiving the first detection signal DS1, the source of the PMOS transistor M3 receives the system voltage $V_{DD}$, and the drain of the PMOS transistor M3 is coupled to the drain of the PMOS transistor M1. The gate of the NMOS transistor M4 is coupled to the second sub-detection unit 303 for receiving the second detection signal DS2, the source of the NMOS transistor M4 receives the reference voltage (for example, the ground level GND), and the drain of the NMOS transistor M4 is coupled to the drain of the NMOS transistor M2. Similarly, in other embodiments of the present invention, multiple PMOS transistors (the number thereof is not limited herein) may be coupled to the PMOS transistor M3 in parallel and multiple NMOS transistors (the number thereof is not limited herein) may be coupled to the NMOS transistor M4 in parallel according to the actual design requirements.

Figure 4A:
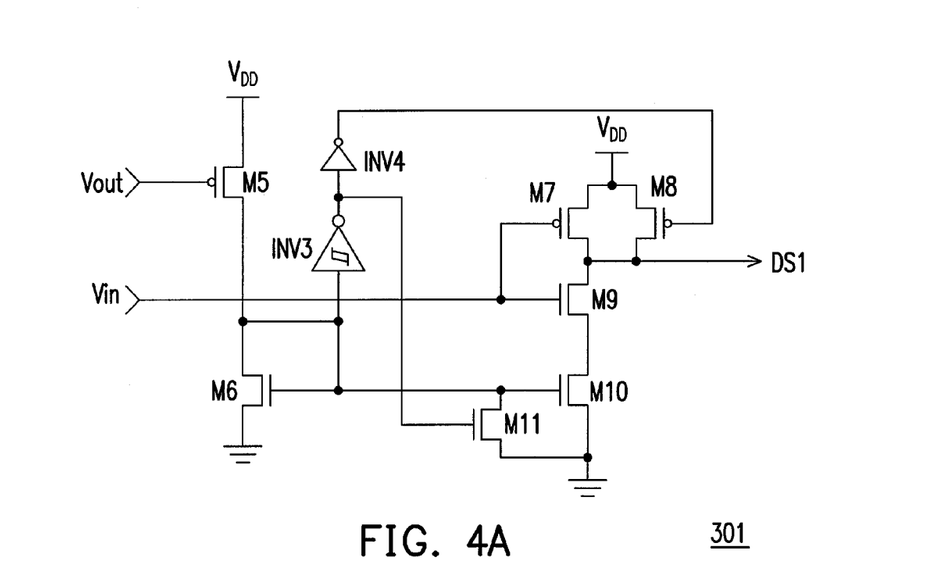
FIG. 4A and FIG. 4B respectively illustrate a first sub-detection unit and a second sub-detection unit according to an embodiment of the present invention.
Figure 4B:
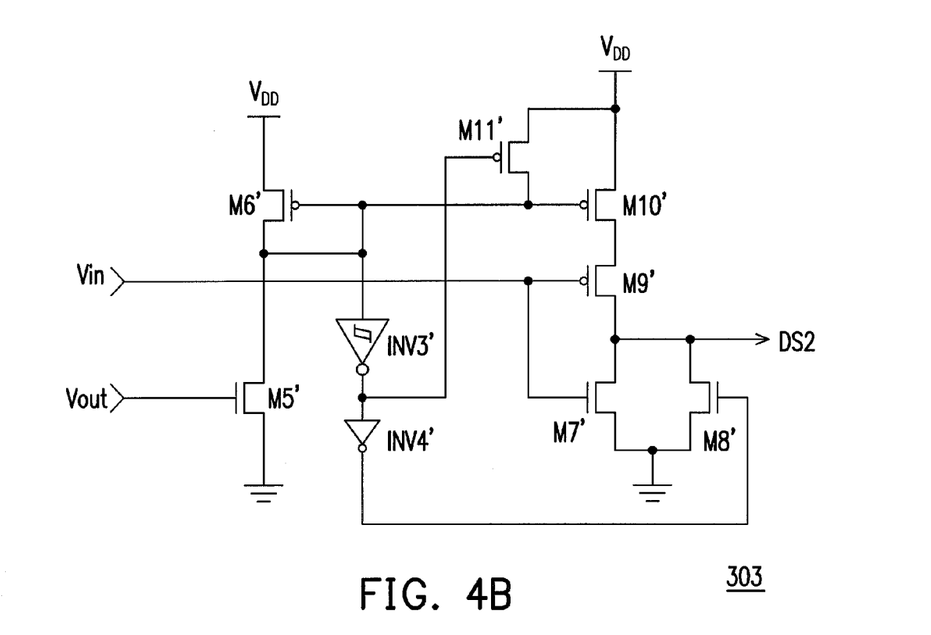

FIG. 4A and FIG. 4B respectively illustrates the first sub-detection unit 301 and the second sub-detection unit 303 according to an embodiment of the present invention. Referring to both FIG. 4A and FIG. 4B, in the present embodiment, the circuit structures of the first sub-detection unit 301 and the second sub-detection unit 303 are complementary to each other. To be specific, the first sub-detection unit 301 includes transistors M5-M11 and inverters INV3 and INV4. The transistors M5, M7, and M8 are implemented by using PMOS transistors, the transistors M6, M9, M10, and M11 are implemented by using NMOS transistors (thereinafter, the transistors M5, M7, and M8 are referred to as PMOS transistors M5, M7, and M8, and the transistors M6, M9, M10, and M11 are referred to as NMOS transistors M6, M9, M10, and M11), and the inverter INV3 is implemented by using a Schmitt trigger inverter. However, the present invention is not limited thereto.

In the present embodiment, the gate of the PMOS transistor M5 receives the output signal Vout, and the source of the PMOS transistor M5 receives the system voltage $V_{DD}$. The gate and drain of the NMOS transistor M6 are coupled to the drain of the PMOS transistor M5, and the source of the NMOS transistor M6 receives the reference voltage (i.e., the ground level GND). The input terminal of the inverter INV3 is coupled to the drain of the PMOS transistor M5. The input terminal of the inverter INV4 is coupled to the output terminal of the inverter INV3. The gate of the PMOS transistor M7 receives the input signal Vin, and the source of the PMOS transistor M7 receives the system voltage $V_{DD}$.

The gate of the PMOS transistor M8 is coupled to the output terminal of the inverter INV4, the source of the PMOS transistor M8 receives the system voltage $V_{DD}$, and the drain of the PMOS transistor M8 is coupled to the drain of the PMOS transistor M7 for outputting the first detection signal DS1. The gate of the NMOS transistor M9 receives the input signal Vin, and the drain of the NMOS transistor M9 is coupled to the drain of the PMOS transistor M7. The gate of the NMOS transistor M10 is coupled to the gate of the NMOS transistor M6, the drain of the NMOS transistor M10 is coupled to the source of the NMOS transistor M9, and the source of the NMOS transistor M10 receives the reference voltage (i.e., the ground level GND). The gate of the NMOS transistor M11 is coupled to the output terminal of the inverter INV3, the drain of the NMOS transistor M11 is coupled to the gate of the NMOS transistor M10, and the source of the NMOS transistor M11 receives the reference voltage (i.e., the ground level GND).

In the present embodiment, when the first sub-detection unit 301 detects that the level of the output signal Vout at its rising edge is higher than the first predetermined level, the first sub-detection unit 301 outputs a high-level first detection signal DS1 to turn off the corresponding PMOS transistor M3 in the auxiliary output stage 207 (this is because the PMOS transistors to be served as a current source in the first sub-detection unit 301 is turned off). Otherwise, the first sub-detection unit 301 outputs a low-level first detection signal DS1 to turn on the corresponding PMOS transistor M3 in the auxiliary output stage 207. In the present example, the first predetermined level is $V_{DD}$-Vth, wherein Vth is a threshold voltage of the PMOS transistor M5. However, the present invention is not limited thereto, and the first predetermined level may be determined according to the actual design requirement.

On the other hand, the second sub-detection unit 303 includes transistors M5'-M11' and inverters INV3' and INV4'. The transistors M5', M7', and M8' are implemented by using NMOS transistors, the transistors M6', M9', M10', and M11' are implemented by using PMOS transistors (thereinafter, the transistors M5', M7', and M8' are referred to as NMOS transistors M5', M7', and M8', and the transistors M6', M9', M10', and M11' are referred to as PMOS transistors M6', M9', M10', and M11'), and the inverter INV3' is implemented by using a Schmitt trigger inverter. However, the present invention is not limited thereto.

In the present embodiment, the gate of the NMOS transistor M5' receives the output signal Vout, and the source of the NMOS transistor M5' receives the reference voltage (i.e., the ground level GND). The gate and the drain of the PMOS transistor M6' are coupled to the drain of the NMOS transistor M5', and the source of the PMOS transistor M6' receives the system voltage $V_{DD}$. The input terminal of the inverter INV3' is coupled to the drain of the NMOS transistor M5'. The input terminal of the inverter INV4' is coupled to the output terminal of the inverter INV3'. The gate of the NMOS transistor M7' receives the input signal Vin, and the source of the NMOS transistor M7' receives the reference voltage (i.e., the ground level GND).

The gate of the NMOS transistor M8' is coupled to the output terminal of the inverter INV4', the source of the NMOS transistor M8' receives the reference voltage (i.e., the ground level GND), and the drain of the NMOS transistor M8' is coupled to the drain of the NMOS transistor M7' for outputting the second detection signal DS2. The gate of the PMOS transistor M9' receives the input signal Vin, and the drain of the PMOS transistor M9' is coupled to the drain of the NMOS transistor M7'. The gate of the PMOS transistor M10' is coupled to the gate of the PMOS transistor M6', the drain of the PMOS transistor M10' is coupled to the source of the PMOS transistor M9', and the source of the PMOS transistor M10' receives the system voltage $V_{DD}$. The gate of the PMOS transistor M11' is coupled to the output terminal of the inverter INV3', the drain of the PMOS transistor M11' is coupled to the gate of the PMOS transistor M10', and the source of the PMOS transistor M11' receives the system voltage $V_{DD}$.

In the present embodiment, when the second sub-detection unit 303 detects that the level of the output signal Vout at its falling edge is lower than the second predetermined level, the second sub-detection unit 303 outputs a low-level second detection signal DS2 to turn off the corresponding NMOS transistor M4 in the auxiliary output stage 207 (this is because the NMOS transistors to be served as a current source in the second sub-detection unit 303 is turned off). Otherwise, the second sub-detection unit 303 outputs a high-level second detection signal DS2 to turn on the corresponding NMOS transistor M4 in the auxiliary output stage 207. In the present example, the second predetermined level is Vth, wherein Vth is a threshold voltage of the NMOS transistor M5'. However, the present invention is not limited thereto, and the second predetermined level may be determined according to the actual design requirement.

Figure 5:
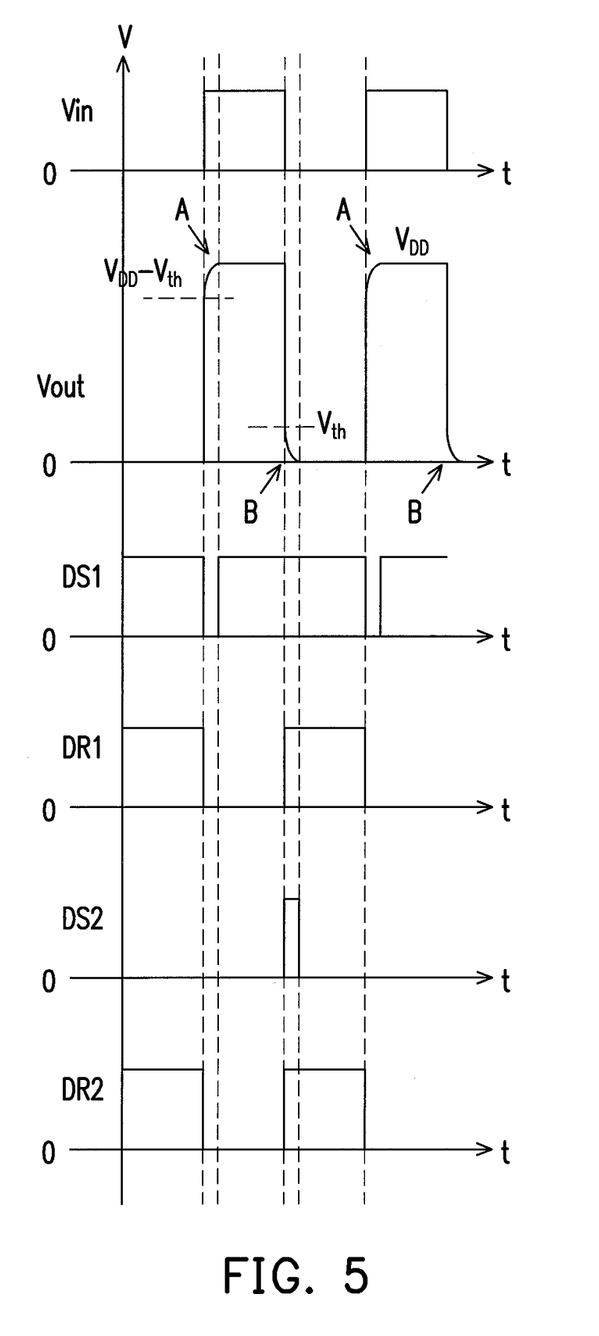
FIG. 5 illustrates the waveforms of an input signal, an output signal, two driving signals, and two detection signals of a driving circuit according to an embodiment of the present invention.

FIG. 5 illustrates the waveforms of the input signal Vin, the output signal Vout, the two driving signals DR1 and DR2, and the two detection signals DS1 and DS2 in the driving circuit 100 according to an embodiment of the present invention. Referring to FIGS. 1-5, before the output signal Vout rises from the ground level GND to the first predetermined level $V_{DD}$-Vth at its rising edge, because the first sub-detection unit 301 constantly outputs the low-level first detection signal DS1 and the second sub-detection unit 303 constantly outputs the low-level second detection signal DS2, the auxiliary output stage 207 is turned on and accordingly the output force of the main output stage 203 is in a first output level (i.e., the output force is enhanced). In other words, the main output stage 203 and the auxiliary output stage 207 are both turned on before the output signal Vout rises from the ground level GND to the first predetermined level $V_{DD}$-Vth at its rising edge, so that the driving power of the driving circuit 100 is increased and accordingly the speed of the driving circuit 100 for transmitting a digital signal in an IC is increased.

On the other hand, when the output signal Vout rises over the first predetermined level $V_{DD}$-Vth at its rising edge, because the first sub-detection unit 301 outputs the high-level first detection signal DS1 while the second sub-detection unit 303 still outputs the low-level second detection signal DS2, the auxiliary output stage 207 is turned off and accordingly the output force of the main output stage 203 is in a second output level (i.e., the output force is maintained), wherein the first output level of the output force is higher than the second output level thereof. In other words, only the main output stage 203 is turned on when the output signal Vout rises over the first predetermined level $V_{DD}$-Vth at its rising edge, so that the driving power of the driving circuit 100 is maintained at the output force of the main output stage 203 (i.e., the driving power of the driving circuit 100 is reduced), and accordingly the output signal Vout presents different patterns before and after its level reaches the first predetermined level $V_{DD}$-Vth at its rising edge (as denoted by A in FIG. 5). Thus, the problem of over damping on the output signal Vout is avoided because of the low output force of the main output stage 203 alone.

Similarly, before the output signal Vout falls from the system voltage $V_{DD}$ to the second predetermined level Vth at its falling edge, because the first sub-detection unit 301 constantly outputs the high-level first detection signal DS1 and the second sub-detection unit 303 constantly outputs the high-level second detection signal DS2, the auxiliary output stage 207 is turned on so that the output force of the main output stage 203 is in a first output level (i.e., the output force is enhanced). In other words, the main output stage 203 and the auxiliary output stage 207 are both turned on before the output signal Vout falls from the system voltage $V_{DD}$ to the second predetermined level Vth at its falling edge, so that the driving power of the driving circuit 100 is increased and accordingly the speed of the driving circuit 100 for transmitting a digital signal in an IC is increased.

On the other hand, when the output signal Vout falls over the second predetermined level Vth at its falling edge, because the first sub-detection unit 301 still outputs the high-level first detection signal DS1 while the second sub-detection unit 303 outputs the low-level second detection signal DS2, the auxiliary output stage 207 is turned off so that the output force of the main output stage 203 is maintained. In other words, only the main output stage 203 is turned on when the output signal Vout falls over the second predetermined level Vth at its falling edge, so that the driving power of the driving circuit 100 is maintained at the output force of the main output stage 203 (i.e., the driving power of the driving circuit 100 is reduced), and accordingly the output signal Vout presents different patterns before and after its level reaches the second predetermined level Vth at its falling edge (as denoted by B in FIG. 5). Thus, the problem of over damping on the output signal Vout is avoided because of the low output force of the main output stage 203 alone.

It should be mentioned that ideally, the detection unit 209 has both the first sub-detection unit 301 and the second sub-detection unit 303. However, in other embodiments of the present invention, the detection unit 209 may also have only the first sub-detection unit 301 or the second sub-detection unit 303 without departing the scope of the present invention.

It should be mentioned that according to foregoing descriptions, any mechanism/technique that can turn off a portion of the driving power of the driving circuit 100 according to the level of the output signal Vout (i.e., turn off a portion of the driving power of the driving circuit 100 through a feedback mechanism) is within the scope of the present invention. In addition, even though the detection unit 209 detects the threshold voltage (Vth) of a MOS transistor in foregoing embodiment, any other detection mechanism or technique (for example, a mechanism or technique that changes the predetermined levels or detects a current instead of the threshold voltage to turn off a portion of the driving power of the driving circuit 100 through a feedback mechanism) may also be applied to the present invention.

Moreover, the driving circuit 100 in the embodiments described above is not limited to being applied in a digital I/O interface, and which may also be a non-digital I/O interface without departing the scope of the present invention. Furthermore, the driving circuit 100 may also be integrated with a conventional technique for adjusting/controlling the slew rates of inverters in the driving stage. Thereby, the driving circuit 100 in the present invention becomes a multiple control selection design scheme.

As described above, the present invention provides a driving circuit, wherein the output force of the main output stage is adaptively adjusted according to the level of an output signal of the driving circuit. When the level of the output signal at its rising edge and falling edge is respectively higher than a first predetermined level and lower than a second predetermined level, the auxiliary output stage is turned off and only the main output stage is turned on. In this case, a smaller output force is produced by the main output stage alone and accordingly the problem of over damping on the output signal is avoided. Contrarily, when the level of the output signal at its rising edge and falling edge is respectively lower than the first predetermined level and higher than the second predetermined level, both the main output stage and the auxiliary output stage are turned on. Because the first predetermined level and the second predetermined level are respectively close to a high level and a low level, the transmission speed of the output signal is not affected. Thereby, in the driving circuit provided by the present invention, the speed of signal output is increased and accordingly the problem of over damping is avoided when the driving power is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A driving circuit, comprising:
   a main output stage, for receiving at least one driving signal and outputting an output signal corresponding to an input signal accordingly; and
   an enhancing unit, coupled to the main output stage, for receiving and detecting a level of the output signal, so as to drive an output force of the main output stage at a first output level or a second output level, wherein the first output level is higher than the second output level,
   wherein if the enhancing unit detects that the level of the output signal at a rising edge is higher than a first predetermined level, the enhancing unit drives the output force of the main output stage at the second output level, otherwise the enhancing unit drives the output force of the main output stage at the first output level;
   wherein if the enhancing unit detects that the level of the output signal at a falling edge is lower than a second predetermined level, the enhancing unit drives the output force of the main output stage at the second output level, otherwise the enhancing unit drives the output force of the main output stage at the first output level;
   wherein the first predetermined level is different from the second predetermined level,
   wherein the enhancing unit comprises:
   an auxiliary output stage, coupled to the main output stage, for receiving a first and a second detection signals, so as to drive the output force of the main output stage at the first output level or the second output level; and
   a detection unit, coupled to the main output stage and the auxiliary output stage, for receiving the input signal and the output signal and detecting the level of the output signal at a rising edge and a falling edge, so as to output the first and the second detection signals for turning on/off the auxiliary output stage,
   wherein the detection unit comprises:
   a first sub-detection unit, for receiving the input signal and the output signal and detecting the level of the output signal at the rising edge, so as to output the first detection signal, and the first sub-detection unit comprising:
   a first transistor, having a gate for directly receiving the output signal and a source for directly receiving a system voltage;
   a second transistor, having a gate and a drain both directly coupled to a drain of the first transistor, and a source for directly receiving a reference voltage;
   a first inverter, having an input terminal directly coupled to the drain of the first transistor;
   a second inverter, having an input terminal directly coupled to an output terminal of the first inverter;
   a third transistor, having a gate for directly receiving the input signal and a source for directly receiving the system voltage;
   a fourth transistor, having a gate directly coupled to an output terminal of the second inverter, a source for directly receiving the system voltage, and a drain directly coupled to a drain of the fourth transistor for outputting the first detection signal;
   a fifth transistor, having a gate for directly receiving the input signal and a drain directly coupled to the drain of the third transistor;
   a sixth transistor, having a gate directly coupled to the gate of the second transistor, a drain directly coupled to a source of the fifth transistor, and a source for directly receiving the reference voltage; and
   a seventh transistor, having a gate directly coupled to the output terminal of the first inverter, a drain directly coupled to the gate of the sixth transistor, and a source for directly receiving the reference voltage; and
   a second sub-detection unit, for receiving the input signal and the output signal and detecting the level of the output signal at the falling edge, so as to output the second detection signal,
   wherein the at least one driving signal comprises a first driving signal and a second driving signal, and the driving circuit further comprises a driving stage, coupled to the main output stage, for receiving the input signal and outputting the first driving signal and the second driving signal accordingly, wherein the first driving signal and the second driving signal have a same phase, and the first driving signal and the second driving signal are reverse to the input signal,
   wherein the main output stage comprises:
   at least one eighth transistor, having a gate for receiving the first driving signal and a source for receiving the system voltage; and
   at least one ninth transistor, having a gate for receiving the second driving signal, a source for receiving the reference voltage, and a drain coupled to a drain of the eighth transistor for outputting the output signal,
   wherein the auxiliary output stage comprises:
   at least one tenth transistor, having a gate coupled to the first sub-detection unit for receiving the first detection signal, a source for receiving the system voltage, and a drain coupled to the drain of the eighth transistor; and
   at least one eleventh transistor, having a gate coupled to the second sub-detection unit for receiving the second detection signal, a source for receiving the reference voltage, and a drain coupled to the drain of the ninth transistor.

2. The driving circuit according to claim 1, wherein the driving stage comprises a pair of driving units, and the pair of driving units comprises:

a third inverter, having an input terminal for receiving the input signal and an output terminal for outputting the first driving signal; and a fourth inverter, having an input terminal for receiving the input signal and an output terminal for outputting the second driving signal.

3. The driving circuit according to claim 2, wherein slew rates of the third inverter and the fourth inverter are controllable.

4. The driving circuit according to claim 1, wherein if the first sub-detection unit detects that the level of the output signal at the rising edge is higher than the first predetermined level, the first sub-detection unit outputs the first detection signal having a first state, otherwise the first sub-detection unit outputs the first detection signal having a second state.

5. The driving circuit according to claim 4, wherein the first state is a high level, and the second state is a low level.

6. The driving circuit according to claim 1, wherein the first inverter is a Schmitt trigger inverter, the first transistor, the third transistor, the fourth transistor, the eighth transistor, and the tenth transistor are PMOS transistors, and the second transistor, the fifth transistor, the sixth transistor, the seventh transistor, the ninth transistor, and the eleventh transistor are NMOS transistors.

7. The driving circuit according to claim 1, wherein the second sub-detection unit comprises:

a twelfth transistor, having a gate for directly receiving the output signal and a source for directly receiving the reference voltage;

a thirteenth transistor, having a gate and a drain both directly coupled to a drain of the twelfth transistor and a source for directly receiving the system voltage;

a third inverter, having an input terminal directly coupled to the drain of the twelfth transistor;

a fourth inverter, having an input terminal directly coupled to an output terminal of the third inverter;

a fourteenth transistor, having a gate for directly receiving the input signal and a source for directly receiving the reference voltage;

a fifteenth transistor, having a gate directly coupled to an output terminal of the fourth inverter, a source for directly receiving the reference voltage, and a drain directly coupled to a drain of the fourteenth transistor for outputting the second detection signal;

a sixteenth transistor, having a gate for directly receiving the input signal and a drain directly coupled to the drain of the fourteenth transistor;

a seventeenth transistor, having a gate directly coupled to the gate of the thirteenth transistor, a drain directly coupled to a source of the sixteenth transistor, and a source for directly receiving the system voltage; and an eighteen transistor, having a gate directly coupled to the output terminal of the third inverter, a drain directly coupled to the gate of the seventeenth transistor, and a source for directly receiving the system voltage.

8. The driving circuit according to claim 7, wherein if the second sub-detection unit detects that the level of the output signal at the falling edge is lower than the second predetermined level, the second sub-detection unit outputs the second detection signal having a first state, otherwise the second sub-detection unit outputs the second detection signal having a second state.

9. The driving circuit according to claim 8, wherein the first state is a low level, and the second state is a high level.

10. The driving circuit according to claim 7, wherein the first inverter and third inverter are Schmitt trigger inverters, the first transistor, the third transistor, the fourth transistor, the eighth transistor, the tenth transistor, the thirteenth transistor, the sixteenth transistor, the seventeenth transistor, and the eighteenth transistor are PMOS transistors, and the second transistor, the fifth transistor, the sixth transistor, the seventh transistor, and the ninth transistor, the eleventh transistor, the twelfth transistor, the fourteenth transistor, and the fifteenth transistor are NMOS transistors.

11. The driving circuit according to claim 1, wherein the driving circuit is an input/output (I/O) interface, and the I/O interface comprises a digital I/O interface or a non-digital I/O interface.

* * * * *